United States Patent [19]
Gardner et al.

[11] Patent Number: 5,804,497
[45] Date of Patent: Sep. 8, 1998

[54] SELECTIVELY DOPED CHANNEL REGION FOR INCREASED $I_{DSAT}$ AND METHOD FOR MAKING SAME

[75] Inventors: Mark I. Gardner, Cedar Creek; H. Jim Fulford, Jr.; Fred N. Hause, both of Austin, all of Tex.

[73] Assignee: Advanced Micro Devices, Inc., Sunnyvale, Calif.

[21] Appl. No.: 695,101

[22] Filed: Aug. 7, 1996

[51] Int. Cl.⁶ ............................................... H01L 21/70
[52] U.S. Cl. ...................................... 438/529; 438/530
[58] Field of Search .................................... 437/34, 41 CS, 437/57, 45; 438/529, 530

[56] References Cited

U.S. PATENT DOCUMENTS

| | | | |
|---|---|---|---|
| 5,283,200 | 2/1994 | Okamoto | 437/29 |
| 5,384,279 | 1/1995 | Stolmeijer | 437/57 |
| 5,422,301 | 6/1995 | Otsuki | 437/70 |
| 5,573,962 | 11/1996 | Sung | 437/34 |

FOREIGN PATENT DOCUMENTS 62-149163   7/1987   Japan .

*Primary Examiner*—John Niebling
*Assistant Examiner*—Brendan Mee
*Attorney, Agent, or Firm*—Kevin L. Daffer; Conley, Rose & Tayon

[57] ABSTRACT

A selectively doped MOS transistor channel includes a deep impurity distribution and shallow impurity distribution. The deep impurity distribution is formed within high energy implant with an impurity of conductivity type opposite to the conductivity type of the source/drain regions of the transistor. In the n-channel regions, the deep impurity distribution preferably includes boron ions. The deep impurity distribution acts as a channel stop such that adjacent source/drain regions of the like type transistors are not inadvertently coupled during circuit operation. The shallow impurity distribution acts as a threshold implant by precisely controlling the doping of the transistor channel in the vicinity of the silicon oxide interface. The peak concentration of the shallow impurity distribution is located at a depth below the silicon surface which is greater than a depth typically associated with a threshold adjust implant. Because the impurity concentration of the shallow impurity distribution drops off rapidly from the peak concentration value, the concentration at the upper surface of the silicon substrate is not significantly greater than the doping of the silicon substrate itself. The light doping in the channel region of the transistor results in a substantially reduced threshold voltage for the transistor. Preferably, the threshold voltage of both the n-channel and p-channel devices has an absolute value of approximately 250 Mv. The lower threshold voltage translates into a higher $I_{Dsat}$ when the transistor is operated under normal conditions (e.g., $V_{Gs}$=3 volts, $V_{Ds}$=3 volts, and $V_{sb}$=0 volts.)

7 Claims, 5 Drawing Sheets

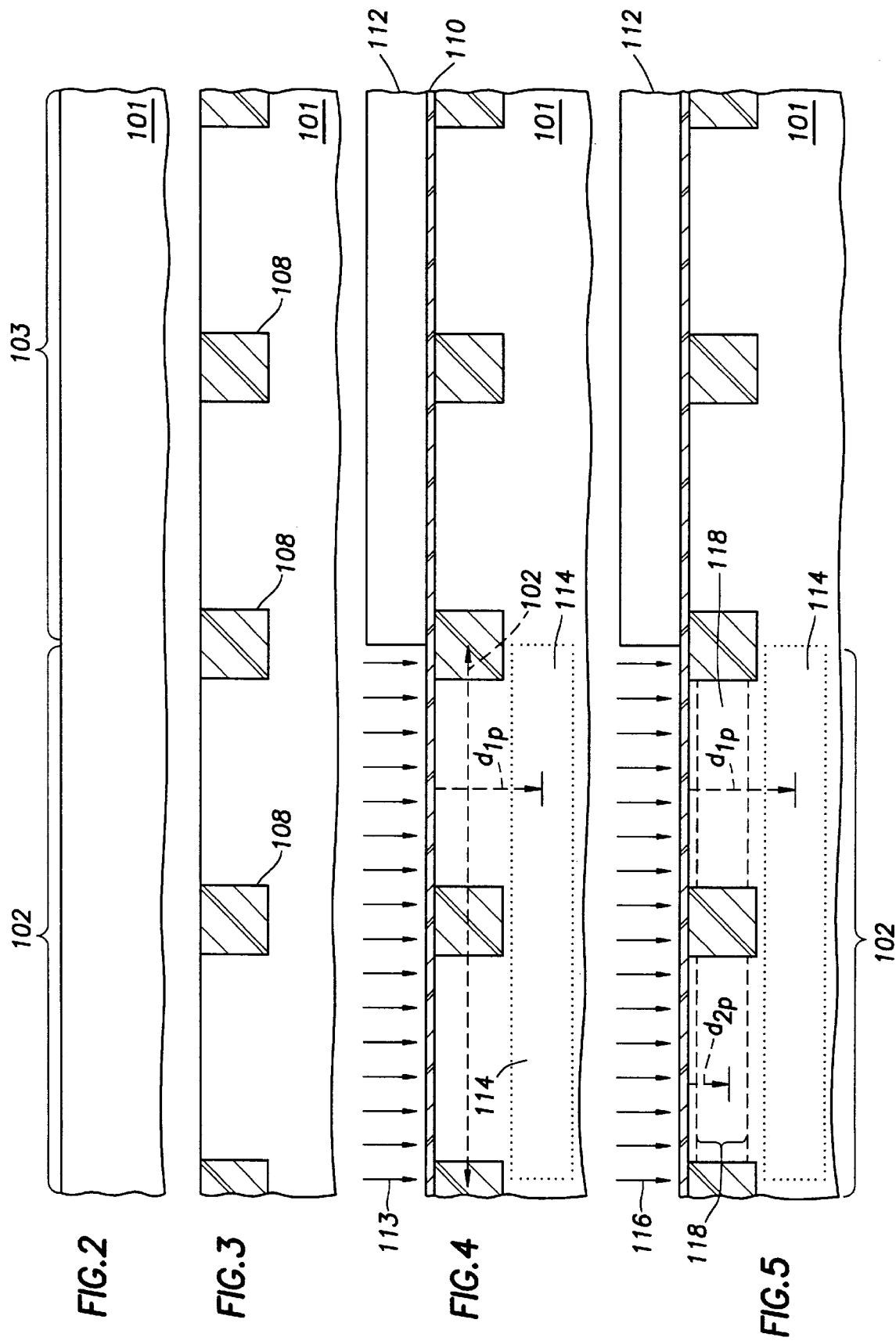

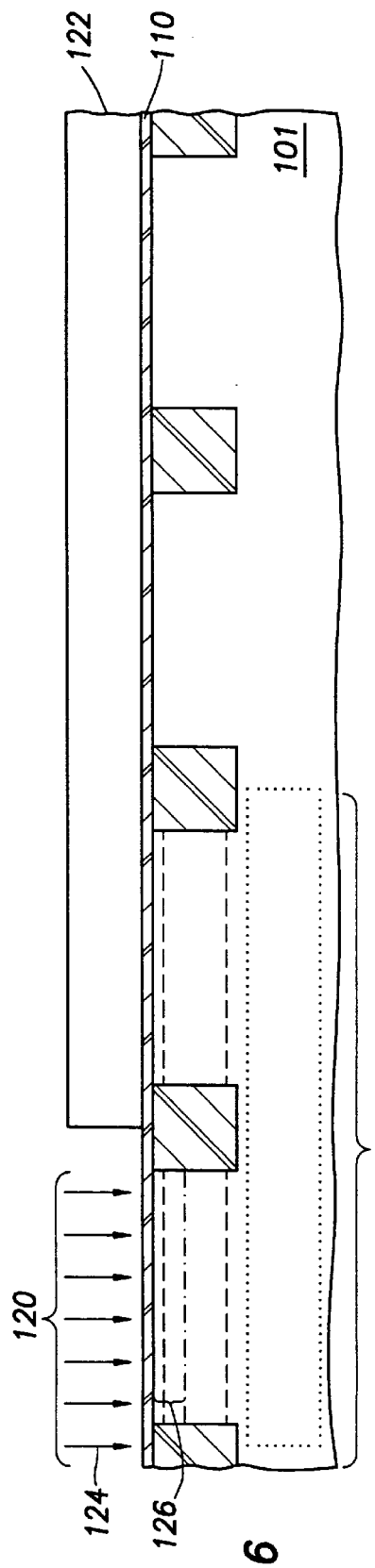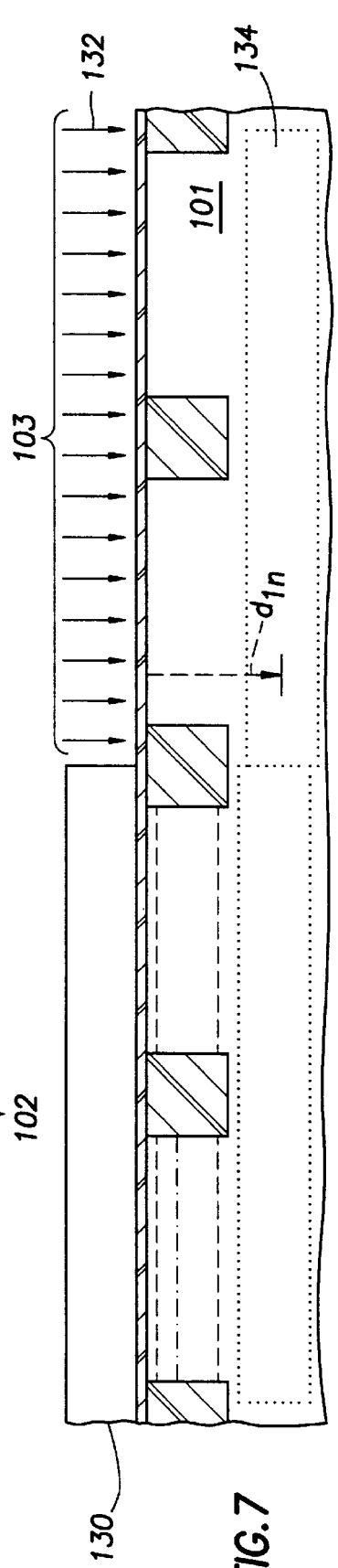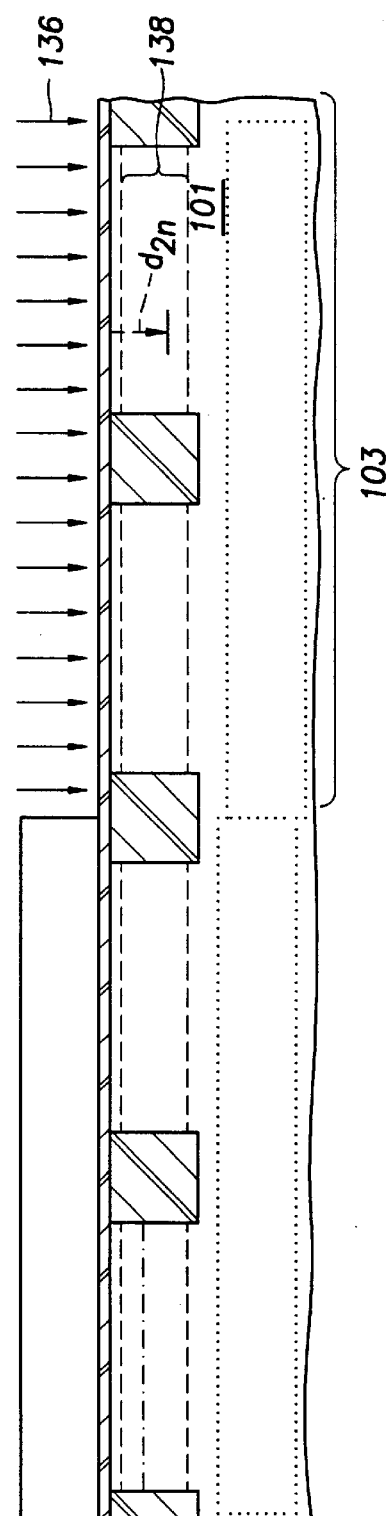

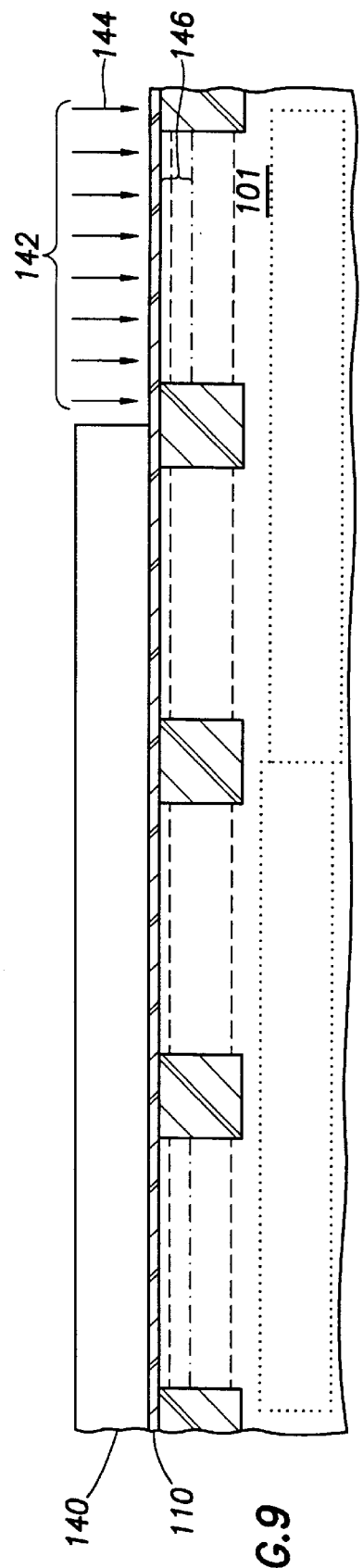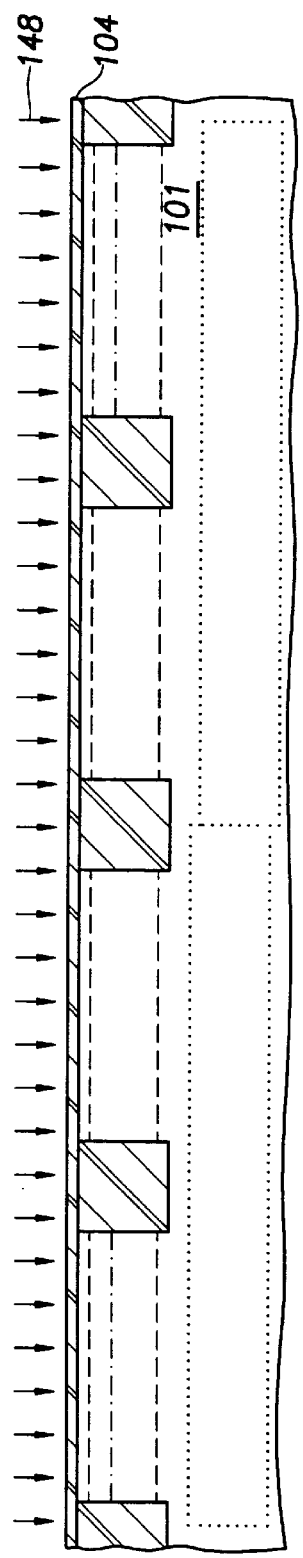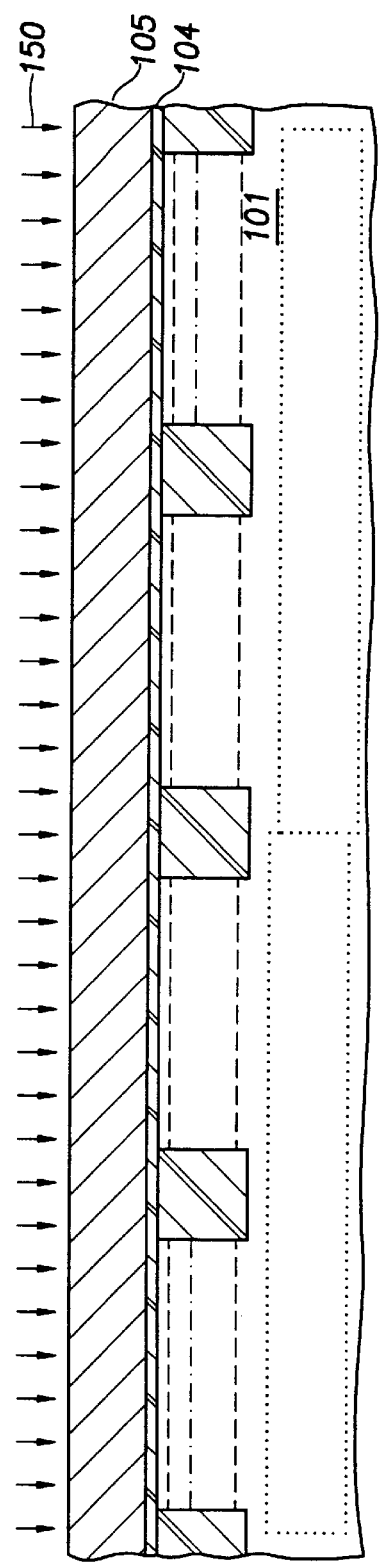

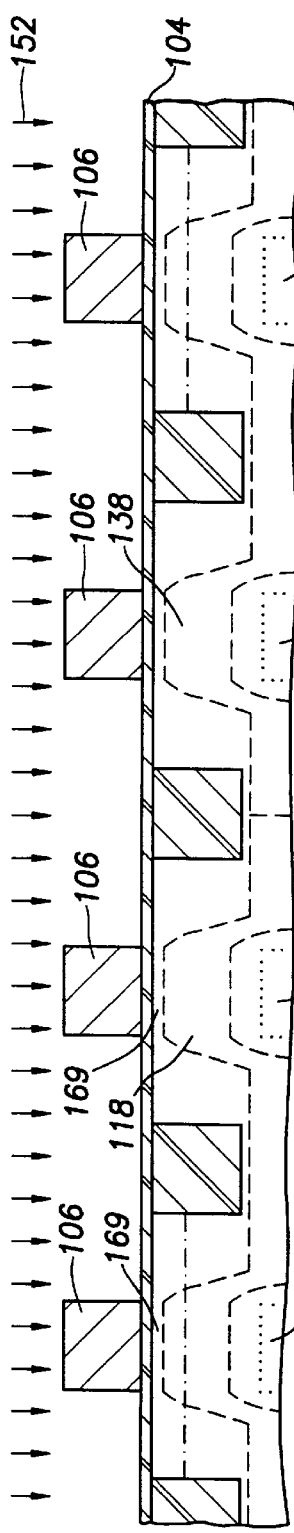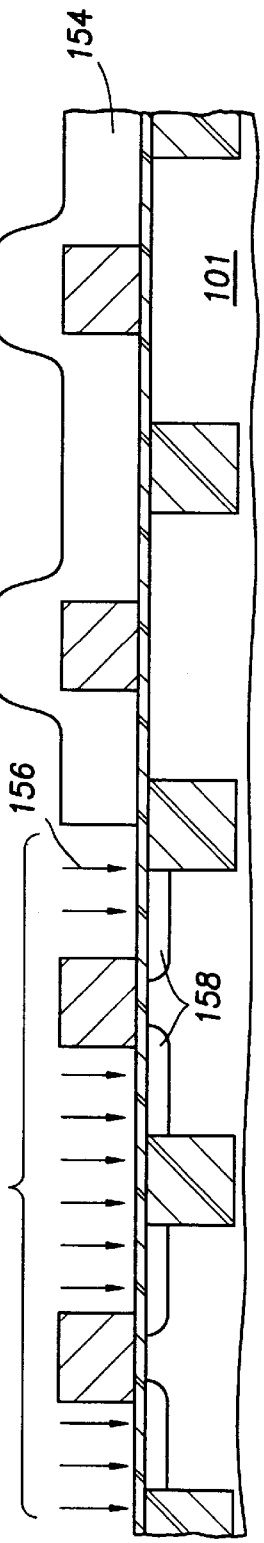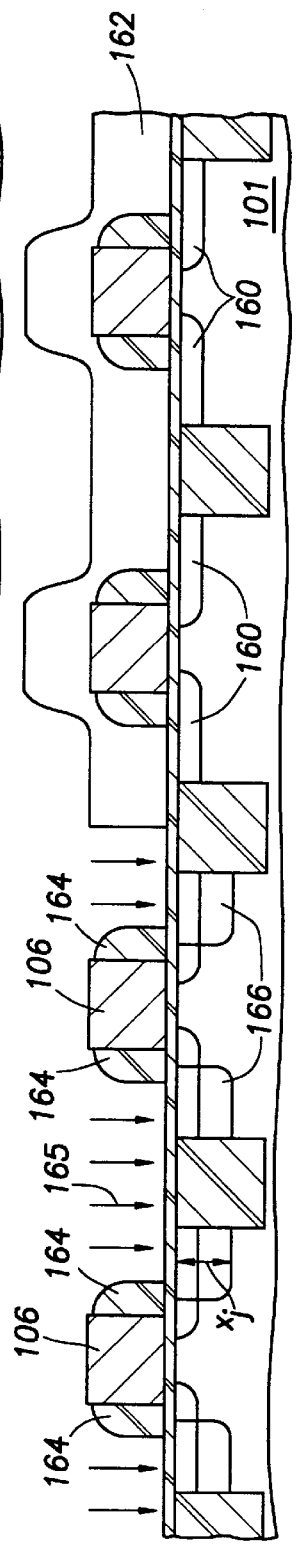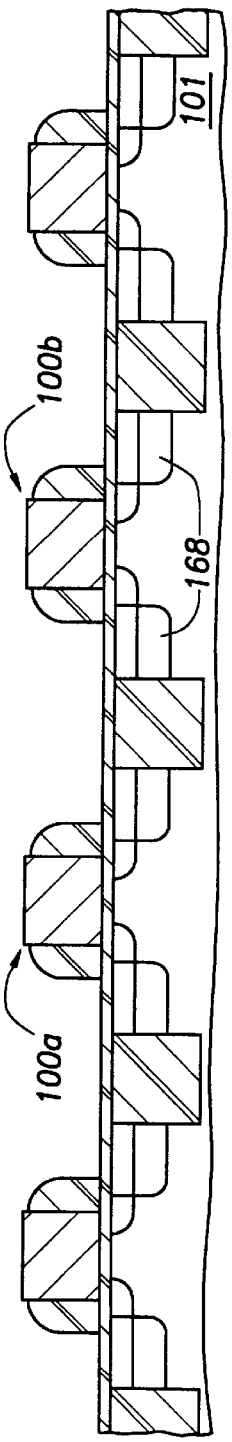

SELECTIVELY DOPED CHANNEL REGION FOR INCREASED $I_{DSAT}$ AND METHOD FOR MAKING SAME

BACKGROUND OF THE INVENTION

1. Field of the Invention

The invention relates to the field of semiconductor processing and more particularly to an MOS transistor having a selectively doped channel region and an improved method for making the same.

2. Description of the Relevant Art

Very large scale integrated (VLSI) metal-oxide-semiconductor ("MOS") circuits include a large number of interconnected transistors formed in a silicon substrate. Typically, the gate electrode of the MOS transistor functions as the transistor's input. The transistor is typically activated or turned on by driving the gate electrode to a specified voltage known as the threshold voltage ($V_T$). Likewise, the drain current ($I_D$) of an MOS transistor typically serves as the transistor's output. Because the gate electrode of each transistor has a small but finite capacitance associated with it, the gate electrode can not instantaneously achieve a desired change in voltage. Instead, a finite amount of time is required to charge the small gate capacitor to the appropriate voltage level. The amount of time required for a gate electrode to achieve a threshold level can be reduced by decreasing the capacitance of the gate electrode or increasing the drain current of transistors from preceding stages. Generally, for small values of $V_D$ ($V_D < V_G - V_T$), the drain current of an MOS transistor increases linearly with the drain voltage (assuming $V_G$ is greater than or equal to $V_T$). As $V_D$ is increased beyond this linear region, however, $I_D$ levels off and becomes independent, to a first order approximation, of the drain voltage. This value of $I_D$ is commonly referred to as $I_{Dsat}$. $I_{Dsat}$ is, therefore, the maximum drain current produced by an MOS transistor operating under normal biasing for a given gate voltage. Thus, it can be seen that $I_{Dsat}$ is a direct measure of the speed of an MOS circuit. Increasing $I_{Dsat}$ increases the integrated circuit's performance by enabling each transistor to drive subsequent stages of transistors to their threshold voltage in less time. Controlling $V_T$ and $I_{Dsat}$ is, therefore, a primary concern of any semiconductor manufacturing process. In complimentary metal-oxide-semiconductor (CMOS) circuits, in which n-channel and p-channel devices are fabricated on a single silicon substrate, threshold voltage and drain current are controlled through a number of interrelated process steps. For example, the resistivity of the starting material and the subsequent doping of the starting material through a series of ion implantation and high temperature processing steps result in a silicon substrate doping profile that, together with the thickness of the gate oxide and the quantity of charged sites within the oxide material, determine the threshold voltage.

In a typical CMOS process, an n-well and a p-well are formed in the starting material with an n-type and a p-type implant respectively. Thereafter, n-channel devices are formed in the p-well while p-channel devices are formed in the n-well. The n-well is formed by implanting an n-type impurity such as phosphorus or arsenic into the silicon substrate and thereafter diffusing the impurity distribution with a high temperature processing step such as an anneal. The p-well is formed in a similar manner using p-type impurities such as boron. After formation of the n-well and p-well, a second pair of implants, commonly referred to as channel stop implants, is performed to reduce the probability of turning on a parasitic or inadvertent transistor. After the channel stop implants have been performed, a third pair of implants is necessary to accurately adjust the threshold voltage of the transistor devices. In a typical CMOS process, these threshold adjust implants must be precisely controlled so that the resulting dopant profile is maintained in a narrow region just below the silicon-oxide interface. In addition to requiring great care during the implant procedure itself, maintaining the profile of the threshold adjust implants within the narrow channel region proximal to the upper surface of the semiconductor substrate requires strict attention to subsequent processing steps in which high temperatures are encountered.

Threshold adjust implants are often designed such that the absolute value of the threshold voltage for both the n-channel and p-channel devices is approximately 700 mV. As device geometries have shrunk below 0.5 microns, it has become common to reduce the operating voltage of the circuit from 5 volts to 3 volts. This reduction in operating voltage results in smaller values of $I_{Dsat}$, thereby slowing circuit performance. Moreover, the typical CMOS fabrication process as described above is inflexible in that the implant steps must be performed prior to formation of the transistor gate dielectric and transistor gate electrodes.

It would therefore be desirable to implement a fabrication process that reduces the number of implant steps required to dope the transistor channel region, increases the flexibility of the process by allowing implants in a variety of locations within the processing sequence, is less susceptible to manufacturing error and requires less stringent control, and results in superior operating characteristics in the form of lower threshold voltages and higher saturated drain currents.

SUMMARY OF THE INVENTION

The problems outlined above are in large part addressed by a selectively doped transistor channel region and a method for making the same. The selectively doped transistor channel can be formed in conjunction with either a p-channel or n-channel transistor, or both in a CMOS process. The selectively doped channel includes a deep (i.e. high energy) impurity distribution and shallow (low energy) impurity distribution. The deep impurity distribution is formed with a high energy implant using an impurity of conductivity type opposite to the conductivity type of the source/drain regions of the transistor. In the n-channel regions, the deep impurity distribution preferably includes boron ions. The deep impurity distribution acts as a channel stop such that adjacent source/drain regions of the like type transistors are not inadvertently coupled during circuit operation. The shallow impurity distribution acts as a threshold implant by precisely controlling the doping of the transistor channel in the vicinity of the silicon oxide interface and as a punch through protection by increasing the impurity concentration proximal to the source/drain regions. The peak concentration of the shallow impurity distribution is, however, located at a depth below the silicon surface which is greater than the depth typically associated with a threshold adjust implant. Because the impurity concentration of any implanted impurity distribution drops off rapidly from the peak concentration value, the concentration at the upper surface of the silicon substrate due to the shallow implant of the present invention is not significantly greater than the doping of the silicon substrate itself. The light doping in the channel region of the transistor results in a substantially reduced threshold voltage for the transistor. Preferably, the threshold voltage of both the n-channel and p-channel devices has an absolute value of approximately 250 mV. These lower threshold voltage translates into a higher $I_{Dsat}$ when the transistor is operated under normal conditions (e.g., $V_{Gs}$=3 volts, $V_{Ds}$=3 volts, and $V_{sb}$=0 volts.)

Broadly speaking, the present invention contemplates an MOS transistor. The transistor has a silicon substrate upon which a gate dielectric and a conductive gate electrode are formed. Preferably, the silicon substrate has a p-type upper region with a resistivity of approximately 12 Ω-cm., the gate dielectric is a thermal oxide of approximately 3 to 9 nm in thickness, and the conductive gate electrode is heavily doped polysilicon. The silicon substrate of the transistor includes a first impurity distribution. The first impurity distribution has boundaries that are substantially parallel to the upper surface of the silicon substrate and has a peak concentration located at a first depth below the silicon substrate upper surface. The transistor also includes a second impurity distribution within the silicon substrate. The second impurity distribution is formed substantially parallel to the upper surface of the silicon substrate and has a peak concentration located at a second depth below the upper surface. Preferably, the first depth is greater than the second depth. The first impurity distribution acts as a channel stop while the second impurity distribution assists in the prevention of punch through by increasing the doping concentration proximal to the source/drain regions while minimizing threshold voltage by preventing significant doping proximal to the silicon oxide interface.

In a presently preferred embodiment, the first impurity distribution comprises a distribution of boron ions having a peak concentration of approximately $5 \times 10^{16}$ cm$^{-3}$ located at a depth of approximately 0.4 microns, while the second impurity distribution comprises a distribution of boron ions having a peak concentration of approximately $1 \times 10^{17}$ cm$^{-3}$ at a depth of approximately 0.2 microns.

In presently preferred p-channel embodiment of the transistor, the first impurity distribution comprises a distribution of phosphorus ions having a peak concentration of approximately $5 \times 10^{16}$ cm$^{-3}$ located at a depth of approximately 0.43 microns, and wherein the second impurity distribution comprises a distribution of phosphorus ions having a peak concentration of approximately $1 \times 10^{17}$ cm$^{-3}$ at a depth of approximately 0.2 microns. In the presently preferred embodiment of the n-channel transistor, $I_{Dsat}$ is a function of the anneal temperature and the oxide thickness. Preferably, the oxide thickness is approximately 6 nm while $I_{Dsat}$ exceeds 700 µA/µm of transistor width. In the preferred embodiment of the p-channel device, the gate oxide is approximately 6 nm thick and the $I_{Dsat}$ exceeds −380 µA/µm of channel width.

The present invention further contemplates a method of doping a channel region of an MOS transistor. First, a silicon substrate having at least one n-channel region and at least one p-channel region is provided. A first p-type impurity is then implanted into the n-channel region at a first p-type energy and a first p-type dose. Next, a second p-type impurity is implanted into the n-channel region at a second p-type energy and a second p-type dose. The method further comprises rapid thermal annealing the silicon substrate to repair damage to the substrate caused by the first and second p-type implants. The method further includes implanting a first n-type impurity into the p-channel region at a first n-type energy and a first n-type dose. Thereafter, a second n-type impurity is implanted into the p-channel region at a n-type energy and a second n-type dose. Thereafter, the p-channel region receives a rapid thermal anneal at a second anneal temperature to repair damage to the silicon substrate caused by the n-type implants.

In one embodiment, the method further comprises the following steps prior to the implant sequence described above: A gate dielectric is formed on an upper surface of the silicon substrate and a gate conductive layer is formed on an upper surface of the gate dielectric layer. In an alternative embodiment, the method further comprises the following steps performed after the implant sequence: Forming a gate dielectric layer on an upper surface of the silicon substrate, forming a gate conductive layer on an upper surface of the gate dielectric layer, and patterning the gate conductive layer to remove portions of the gate conductive layer above source/drain regions of the silicon substrate. In a presently preferred embodiment, the first p-type implant is a boron implant carried out at approximately 140 keV to 300 keV and the first p-type dose is approximately 2.0 to $8.0 \times 10^{12}$ cm$^{-2}$ the second p-type implant is a boron implant with an energy of 50 to 100 keV and a dose of 2.0 to $8.0 \times 10^{12}$ cm$^{-2}$, the first n-type implant is a phosphorus implant with an energy of approximately 360 to 500 keV and a dose of approximately 2.0 to $8.0 \times 10^{12}$ cm$^{-2}$, and the second n-type implant is a phosphorus implant with an energy of approximately 150 to 280 keV and a dose of approximately 2.0 to $8.0 \times 10^{12}$ cm$^{-2}$.

BRIEF DESCRIPTION OF THE DRAWINGS

Other objects and advantages of the invention may become apparent upon reading the following detailed description and upon reference to the accompanying drawings in which:

FIG. 2 is a partial cross-sectional view of an upper region of a silicon substrate;

FIG. 3 is a processing step subsequent to FIG. 2, in which a plurality of isolation structures has been formed in the silicon substrate;

FIG. 4 is a processing step subsequent to FIG. 3, in which a first impurity is implanted into a n-channel region of the silicon substrate through a dielectric layer;

FIG. 5 is a processing step subsequent to FIG. 4, in which a second impurity is implanted into the n-channel region of the silicon substrate;

FIG. 6 is an optional processing step subsequent to FIG. 5, in which a threshold adjust implant is performed on a periphery region of the n-channel region of the silicon substrate;

FIG. 7 is a partial cross-sectional view of a processing step subsequent to FIG. 6, in which a first impurity is implanted into p-channel regions of the silicon substrate through dielectric layer;

FIG. 8 is a processing step subsequent to FIG. 7, in which a second impurity is implanted into the p-channel region of the silicon substrate through a dielectric layer;

FIG. 9 is an optional processing step subsequent to FIG. 8, in which a threshold adjust implant is performed on a peripheral region of the p-channel region of the silicon substrate;

FIG. 10 shows a processing step subsequent to FIG. 9, in which a gate dielectric layer has been formed on an upper surface of the silicon substrate;

FIG. 11 is a processing step subsequent to FIG. 10, in which a conductive gate layer is formed on the gate dielectric layer;

FIG. 12 is a processing step subsequent to FIG. 11, in which the gate dielectric layer has been patterned;

FIG. 13 is a processing step subsequent to FIG. 12, in which an LDD implant is performed in n-channel regions of the silicon substrate;

FIG. 14 is a processing step subsequent to FIG. 13, in which a source/drain implant is performed in n-channel regions of the silicon substrate in the presence of dielectric spacers formed on the patterned gate conductive layer;

FIG. 15 is a processing step subsequent to FIG. 14, in which a source/drain region has been formed in p-channel regions of the silicon substrate.

Figure 1:
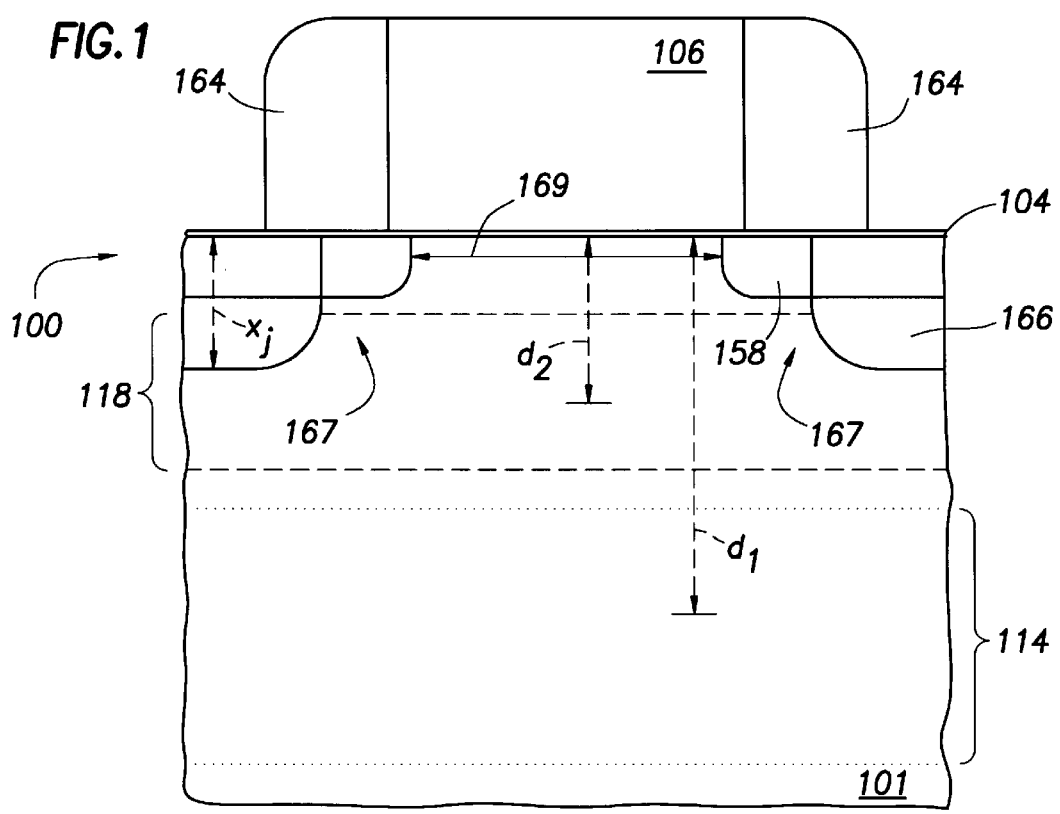
FIG. 1 is a MOS transistor in accordance with the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Turning now to FIG. 1, a transistor according to the present invention is shown. Transistor 100 includes silicon substrate 101 upon which a gate dielectric 104 is formed. Conductive gate electrode 106 is formed on an upper surface of gate dielectric 104. Silicon substrate 101 includes a first impurity distribution 114. As will be appreciated by those skilled in the art of semiconductor fabrication, impurities introduced into a silicon substrate, whether through ion implantation or through a diffusion process, are characterized by an impurity concentration gradient. Typical impurity distributions have a peak concentration value located within the impurity distribution. The impurity concentration of the distribution falls off from the peak concentration value. Thus, typical impurity distributions do not have discrete boundaries that can be easily shown in a drawing. Therefore, for the sake of convenience, impurity distributions in this disclosure are represented by a pair of boundary lines beyond which the concentration of the distribution is approximately 10% or less of the peak concentration value of the distribution. The boundaries first impurity distribution 114 is substantially parallel to an upper surface of silicon substrate 101. A peak concentration of first impurity distribution 114 is located at a first depth d, below the upper surface. First depth $d_1$, in a presently preferred embodiment, is approximately 0.43 microns. The peak concentration value of first impurity distribution 114 is high enough and the first depth d, great enough such that first impurity distribution 114 provides a channel stop that prevents an undesirable conductive path from forming between adjacent transistors 100. Transistor 100 also includes spacer structures 164 formed on substantially vertical sidewalls of gate electrode 106. LDD impurity 158 and source/drain impurity distribution 166 cooperatively form the pair of source/drain regions 167 of transistor 100. Source/drain regions 167 have a junction depth shown as $x_j$ in the figure. In a presently preferred embodiment, an upper region of silicon substrate 101 is a p-type silicon with a resistivity of approximately 10 to 14 Ω-cm.

As will be appreciated to those skilled in the art, transistor 100 can be formed as an n-channel or a p-channel device. In an n-channel embodiment, LDD impurity distribution 158 and source/drain impurity distribution 166 have an n-conductivity type while first impurity distribution 114 has a p-conductivity type. Transistor 100 further includes a second impurity distribution 118 with boundaries that are substantially parallel to an upper surface of silicon substrate 100. Second impurity distribution 118 has a peak concentration value located at a depth $d_2$ below an upper surface of silicon substrate 100. In a preferred embodiment, second depth $d_2$ is approximately equal to 0.2 microns. The peak concentration value and the depth $d_2$ of second impurity distribution 118 are such that second impurity distribution 118 assists in the prevention of punch through while simultaneously providing a threshold adjust implant. The depth $d_2$ of second impurity distribution 118 is great enough, however, that the impurity concentration proximal to an upper surface of silicon substrate 101 is 10% or less than the peak concentration value. Because the impurity concentration proximal to the upper surface of silicon substrate 101 is relatively low, a threshold voltage of transistor 100 will be substantially less than threshold voltage values obtained using conventional threshold adjust implants. In a preferred embodiment, a peak concentration value of second impurity distribution is approximately $1 \times 10^{17}$ cm$^{-3}$. In such an embodiment, the threshold voltage of an n-channel device is approximately 250 mV.

The peak concentration value of second impurity distribution 118 is sufficient such that punch through is prevented. Punch through refers to a phenomenon in which a voltage applied to source/drain region 167 forms a depletion region around the peripheral of source/drain region 167. In short channel devices (i.e., devices having channel lengths less than 0.5 microns), the depletion region formed around a biased source/drain region 167 can extend across channel 169 of transistor 100 eliminating the inversion region associated with the normal operation of MOS transistors and resulting in a space charge limited current inversely proportional to the cube of the channel length. The strong dependence of the punch through current upon the channel length makes it especially important to limit the extent to which the depletion region around drain 167 extends into channel 169. Second impurity distribution 118 decreases the impurity distribution proximal to drain 167 thereby limiting the dimensions of the depletion region. It is to be understood that transistor 100 can be implemented as either an n-channel or p-channel transistor. In an n-channel embodiment, first impurity distribution 114 and second impurity distribution 118 are of a p-type impurity. Conversely, in a p-channel embodiment, first impurity distribution 114, second impurity distribution 118 are of an n-type impurity.

Turning now to FIGS. 2 through 15, a preferred processing sequence for forming transistors 100 (shown in FIG. 15) on a silicon substrate 101 is shown. In FIG. 2, a silicon substrate 101 is provided. Silicon substrate 101 includes at least one n-channel region 102 and at least one p-channel region 103. n-channel region 102 is laterally displaced from p-channel region 103. As their names imply, n-channel region 102 is dedicated to the formation of n-channel transistors whereas p-channel region 103 is reserved for the formation of p-channel transistors. Silicon substrate 101 is preferably comprised of a single crystal silicon structure including an upper region having a resistivity of approximately 12 Ω-cm. In the presently preferred embodiment, silicon substrate 101 includes a bulk substrate region (not shown in the drawing) comprising a heavily doped p+ silicon (i.e., a doping concentration greater than or equal to $10^{19}$ cm$^{-3}$). Upon this p+ bulk silicon, an epitaxial layer of p− silicon is formed as is well known in the art.

FIG. 3 shows a plurality of isolation structures 108 formed in silicon substrate 101. Isolation structures such as structures 108 are well known in the field of MOS integrated circuit fabrication. In the embodiment shown in FIG. 3, shallow trench isolation structures are used to form isolation structures 108. Shallow trench isolation structures are typically formed by selectively etching silicon substrate 101 to produce a plurality of shallow trenches (for purposes of this disclosure, a shallow trench is a trench having a depth of approximately 300 to 500 nm). The trenches are formed by anisotropically etching the silicon substrate after forming a patterned mask with a photolithography process. A trench dielectric is used to fill the shallow trenches after which a planarization process, such as a chemical-mechanical polish is thereafter used to remove the dielectric from regions exterior to the shallow trenches thereby producing a substantially planar upper surface. Isolation structures 108 provide a physical and electrical separation between adjacent transistors formed in silicon substrate 101 to prevent the inadvertent and undesirable coupling of adjacent transistors. Although isolation structures 108 as shown in FIG. 3 are of the shallow trench dielectric variety, it is to be understood that alternative methods of isolating transistors may be employed. For example, it is understood that dielectric structures 108 may comprise semi-recessed local oxidation structures (LOCOS). LOCOS isolation has been a prevalent isolation structure in large scale integrated circuits for many years and is well known in the field. In short channel technologies, it is sometimes desirable to utilize alternative isolation structures rather than LOCOS structures because of the tendency of the well known LOCOS bird's beak to extend into the channel region.

Comparison is made here between the transistor formation process of the present invention with conventional processing techniques. In a conventional complementary metal-oxide-semiconductor (CMOS) process, it is necessary to form the n-well and the p-well prior to the formation of the isolation structures. The well formation process may include the use of a self-aligned mask including a significant thermal oxidation process. In addition to the time and expense required to implement such a process, the formation of the CMOS wells through the use of a thick thermal oxide results in a permanent surface non-planarity between the n-well and p-well regions. As is well known, planar surfaces are more desirable because of the difficulty associated with achieving fine line lithography on non-planar surfaces.

FIGS. 4 through 9 disclose a series of implantation steps used to selectively dope the channel regions of a plurality of transistors. In the flexible process of the present invention, the sequence shown in FIGS. 4 through 9 may be accomplished prior to the formation of a gate dielectric and conductive gate layer, after the formation of the gate dielectric but prior to the formation of the gate conductive layer, after the formation of the gate dielectric and the gate conductive layer, or even after the patterning of the gate conductive layer. In the various embodiments, the sequence may be adjusted by adjusting the implant energies of the various implants to achieve the final desired depth and range of the various impurity distributions. Turning to FIG. 4, a first p-type implant 113 is performed to introduce a first impurity distribution 114 into n-channel regions 102 of silicon substrate 101. Prior to implant 113, an implant dielectric 110 may be optionally formed on an upper surface of silicon substrate 101. Photoresist layer 112 is used to prevent energetic ions from being introduced into p-channel region 103 of silicon substrate 101 during first implant 113. First implant 113 is carried out at a energy sufficient to insure that a peak concentration value of impurity distribution 114 is located at a depth $d_{1p}$ below an upper surface of silicon substrate 101. The distance $d_{1p}$ is chosen such that first impurity distribution 114 is deep enough in silicon substrate 101 to provide an effective channel stop between adjacent transistors. In a presently preferred embodiment, first impurity distribution 114 comprises boron ions having a peak concentration of approximately $5 \times 10^{16}$ ions/cm$^{-3}$ and a depth $d_{1P}$ approximately 0.43 microns below an upper surface of silicon substrate 101. In one embodiment, such a distribution may be formed by implanting boron ions at an energy of approximately 150 keV using a dose of approximately $3.5 \times 10^{12}$ cm$^{-2}$. More generally, first implant 113 is preferably carried out at an energy of 140 to 300 keV using a dose of 2 to $8 \times 10^{12}$ cm$^{-2}$. As noted previously, in an embodiment in which first implant 113 is performed after the formation of a conductive gate layer, it is necessary to adjust the implant energy such that impurity distribution 114 remains in essentially the same position relative to upper surface of silicon substrate 101. It should be also noted that although the embodiment depicts the doping of the n-channel region 102 prior to the doping of the p-channel region 103, it is equally feasible to reverse this order such that the implantation of p-channel region 103 precedes the implantation of n-channel region 102.

Turning now to FIG. 5, second implant 116 is performed to introduce a second impurity distribution 118 into p-channel region 102 of silicon substrate 101. Second implant 116 utilizes the same patterned photoresist layer 112 that was used in the first implant 113 of FIG. 4. Implant 116 is performed such that a peak concentration of second impurity distribution 118 is located at a depth $d_2p$ below an upper surface of silicon substrate 101. In a presently preferred embodiment, second impurity distribution 118 comprises boron ions having a peak concentration value of approximately $1 \times 10^{17}$ cm$^{-3}$ located at a depth below an upper surface of silicon substrate 101 of approximately 0.20 microns. In one embodiment, second impurity distribution may be formed by implanting boron ions at an energy of approximately 60 keV using a dose of approximately $3.0 \times 10^{12}$ cm$^{-2}$. More generally, second implant 116 comprises a boron implant using a dose of 2 to $8 \times 10^{12}$ cm$^{-2}$ and an energy of approximately 50–100 keV. Due to the lower energy of second implant 116 in the preferred embodiment, second impurity distribution 118 is shallower with respect to an upper surface of silicon substrate 101 than first impurity distribution 114. Second impurity distribution 118 provides an effective inhibiting of punch through formation while simultaneously providing a moderate adjustment of the threshold voltage of transistors formed in n-channel region 102. In the preferred embodiment, the depth $d_{2P}$ of second impurity distribution 118 is chosen such that the impurity concentration due to the second impurity distribution 118 at the upper surface of silicon substrate 101 is not great enough to significantly raise the threshold voltage in n-channel region 102. In this manner, the n-channel transistors can be formed with a threshold voltage of approximately 0.25 volts. By forming transistors with a relatively low threshold voltage (where low threshold voltage implies a threshold voltage of less than 500 mV) the drain current of these transistors will be increased. It should be noted that first implant 113 and second implant 116 effectively replace the three implants traditionally associated with conventional CMOS processing namely, the well implant, the channel stop implant, and the threshold adjust implant. By reducing the number of implants required to dope the channel regions within p-channel region 102, the present invention reduces manufacturing complexity and cost while simultaneously providing desirable operating characteristics such as greater saturated drain current $I_{Ds}$.

Turning now to FIG. 6, an optional step is performed for use in conjunction with processors in which it is desirable to utilize n-channel devices of two different types. A photoresist mask 122 is patterned to expose a periphery region 120 of n-channel region 102. Thereafter, a threshold adjust implant 124 may be performed to introduce a threshold adjust impurity distribution 126 into a region proximal to an upper surface of silicon substrate 101. Through the use of this optional and more conventional threshold adjust implant, the threshold voltage of selected transistors may be adjusted so that, for example, it would be possible to have transistors located in periphery regions 120 of n-channel region 102 having 0.7 volt threshold voltages. After the completion of the implantation steps used to dope p-channel region 102 of silicon substrate 101, a high temperature process is desirable to activate the implanted ions and to repair damage done to the silicon lattice caused by the bombardment of the high energy ions necessarily used in an implantation process. While high temperature is desirable to achieve these benefits, high temperatures can also result in the undesirable redistribution of first impurity distribution 114 and second impurity distribution 118. To achieve the desired benefits of high temperature processing while avoiding the redistribution of the implants, a rapid thermal anneal process (not shown in the drawings) may be used. Therefore, a rapid thermal anneal step, preferably performed at a temperature of approximately 1050° to 1075° C., may be performed after second implant 116.

Turning now to FIGS. 7 through 9, a sequence similar to the sequence shown in FIGS. 4 through 6 is used to dope the transistors located within p-channel region 103 of silicon substrate 100. As shown in FIG. 7, a photoresist mask 130 is used to selectively expose p-channel region 103 of silicon substrate 101. A first n-type implant 132 is then performed to introduce a first n-type impurity distribution 134 into silicon substrate 101. First n-type impurity distribution 134 has a peak concentration located at a depth $d_{1N}$ below an upper surface of silicon substrate 101. In a presently preferred embodiment, first n-type impurity distribution 134 has a peak concentration located approximately 0.43 microns below an upper surface of silicon substrate 101 and has a peak concentration value of approximately $5 \times 10^{16}$ cm$^{-3}$. Like first impurity distribution 114 shown in FIG. 4, first n-type impurity distribution 134 is centered at a depth sufficient such that an effective channel stop is performed while providing a source of mobile carriers necessary to form an inversion region at an upper surface of silicon substrate 101. In a preferred embodiment, first n-type implant 132 contemplates a phosphorous ion implant using a dose of approximately $5.0 \times 10^{12}$ cm$^{-2}$ and an energy of approximately 380 keV. More generally, implant 132 includes implants using an energy of 360 to 500 keV and an implant dose of approximately 2 to $8 \times 10^{12}$ cm$^{-2}$.

In FIG. 8, second n-type implant 136 introduces a second n-type impurity distribution 138 into p-channel region 103 of silicon substrate 101. Second n-type impurity distribution 138 has a peak concentration located at a depth $d_2N$ below an upper surface of silicon substrate 101. In a presently preferred embodiment, second n-type implant 136 comprises implanting phosphorus ions with an energy of approximately 160 keV using a dose of approximately $1.33 \times 10^{13}$ cm$^{-2}$. More generally, implant 136 contemplates an implant carried out with an energy of 150 to 280 keV and an implant dose of approximately 2 to $8 \times 10^{12}$ cm$^{-2}$. Second n-type impurity distribution 138 provides an effective mechanism for reducing punch through in the p-channel region while simultaneously adjusting the threshold value within p-channel region 103 of silicon substrate 101. In a presently preferred embodiment, second impurity distribution 138 is located at a depth $d_{2N}$ of approximately 0.19 microns and has a peak concentration value of approximately $1 \times 10^{17}$ cm$^{-3}$.

In the preferred embodiment, silicon substrate 101, first n-type impurity distribution 134, and second n-type impurity distribution 138 provide a p-channel threshold voltage of approximately −250 mV. Preferably, a rapid thermal anneal step (not shown) is performed subsequent to second n-type implant 136. In the preferred embodiment, this rapid thermal anneal is carried out at the temperature of approximately 1000° to 1025° C. In FIG. 9, a p-channel threshold adjust implant step analogous to the n-channel threshold adjust implant step shown and described with respect to FIG. 6 is performed. Photoresist mask 140 is patterned to selectively expose periphery regions 142 of p-channel region 103. Thereafter, a p-channel threshold adjust implant 144 is executed to produce a p-channel threshold adjust impurity distribution 146 proximal to an upper surface of silicon substrate 101. In this manner, the threshold voltage of selected p-channel devices may be adjusted to produce p-channel transistors having threshold voltages of, for example, −0.70 volts. In processes which use a threshold adjust implant 142, it may be desirable to locate the rapid thermal anneal process subsequent to the threshold adjust implant.

Turning now to FIG. 10, a gate dielectric layer 104 is formed on an upper surface of silicon substrate 101. Gate dielectric layer 104 typically comprises a thermally formed oxide layer of approximately 5 to 20 nm. In a presently preferred embodiment, the thickness of gate dielectric layer 104 is approximately 6 nm. The implant symbols shown as reference numeral 148 in the drawings represent the sequence of implants shown and described with respect to FIGS. 4 through 9. In other words, the present invention contemplates an embodiment in which gate dielectric layer 104 is formed on silicon substrate 101 prior to the execution of the processing sequence shown and described with respect to FIGS. 4 through 9. Such an embodiment may have the advantage of eliminating the necessity of dielectric oxide 110. In FIG. 11, a conductive gate layer 105 is formed on gate dielectric layer 104. In the preferred embodiment, gate dielectric layer 105 is a heavily doped CVD polysilicon film as is well known in the art. For purposes of this disclosure, heavily doped polysilicon refers to polysilicon films having a sheet resistivity less than or equal to approximately 500 Ω/sq. The implants identified by reference symbol 115 indicate the possibility that the implant sequence of FIGS. 4 through 9 may be performed after the formation of gate conductive layer 105. As will be appreciated to those skilled in the art, the implant energies suggested in the preceding discussion would have to be significantly adjusted upward to account for the film thickness of gate conductive layer 105. It is contemplated that each of the implants shown in FIGS. 4 through 9 would have to be carried out in the MeV range using commercially available high energy implanters.

In FIG. 12, gate conductive layer 105 is patterned using conventional photolithography processes not shown in the drawing to create a plurality of conductive gate electrodes 106. Conductive gate electrodes 106 are formed such that they are aligned over a channel region 109 associated with each of the transistors 100 to be formed. The implants identified by reference numeral 152 once again refer to a processing sequence in which the implant sequence of FIGS. 4 through 9 is carried out subsequent to the patterning of conductive gate layer 105. In such an embodiment, the high energies required to produce the desired impurity distribution under the regions of silicon substrate 101 covered by conductive gate electrode 106 will result in the impurity distribution profiles shown in FIG. 12. More specifically, it is noted that exterior to the channel region 169 of silicon substrate 101, such high energy implants will drive the impurity distributions to well within the silicon substrate.

Turning now to FIGS. 13 through 15, a sequence is shown for forming the source/drain regions of the individual transistors 100. The process sequence shown uses lightly doped drains (LDD) for both the n-channel and the p-channel regions. In such an embodiment, a photoresist layer 154 is formed to expose n-channel region 102 of silicon substrate 101. Thereafter, an n-LDD implant 156 is carried out to introduce lightly doped drain 158 into silicon substrate 101. In a preferred embodiment, lightly doped drain 158 comprise a distribution of phosphorus ions. Thereafter, in a processing sequence not shown in the figures, a mirror image process is performed to introduce p-LDD impurities into the p-channel region 103 of silicon substrate 101. Specifically, a photoresist layer is patterned to expose p-channel region 103 of silicon substrate 101 and a p-type implant is used to introduce p-type ions, preferably boron, into silicon substrate 101. Lightly doped drain regions 158 and 160 of FIGS. 13 and 14 are used to reduce the maximum E-field produced near the drain region thereby minimizing the hot carrier effects associated with short channel devices. Lightly doped drain regions 158 and 160 are typically very shallow implants (i.e., implants having junction depths less than 100 nm). After the formation of LDD regions 158 and 160, spacer structures 164 are formed on the sidewalls of the conductive gate electrodes 106. Spacer structures 164 are typically formed by depositing a conformal dielectric layer, such as a $CV_D$ oxide formed from a TEOS source, upon the patterned gate layer and thereafter anisotropically etching the conformal dielectric layer to just clear the dielectric in the planar regions. If the etch process is carried out with minimal overetch, spacer structures 164 will be left on the sidewalls of gate electrode 106. Thereafter, source/drain implant 165 is performed to introduce source/drain regions 166 into silicon substrate 101. Source/drain implant 165 is typically executed such that source/drain region 166 has a higher impurity concentration than LDD region 158 and has a greater junction depth as well. In a presently preferred embodiment, the junction depth $x_j$ of source/drain region 166 is approximately 150 to 200 nm. In a sequence not shown in FIG. 14, source/drain regions 166 are formed in p-channel regions 103 of silicon substrate 101 by first patterning a photoresist layer to expose p-channel region 103 of silicon substrate 101. Thereafter, a p-channel type implant is performed to introduce a heavy concentration of boron atoms into source/drain regions 168 of silicon substrate 100. FIG. 15 shows an n-channel transistor 100a and p-channel transistor 100b of the present invention. The impurity distributions associated with the implant sequence of FIGS. 4 through 9 has been eliminated from the drawings of FIG. 13 through 15 to improve the clarity and simplicity of FIGS. 13 through 15. It is to be understood, however, that the impurity distributions referred to are present nevertheless.

Figure 16:
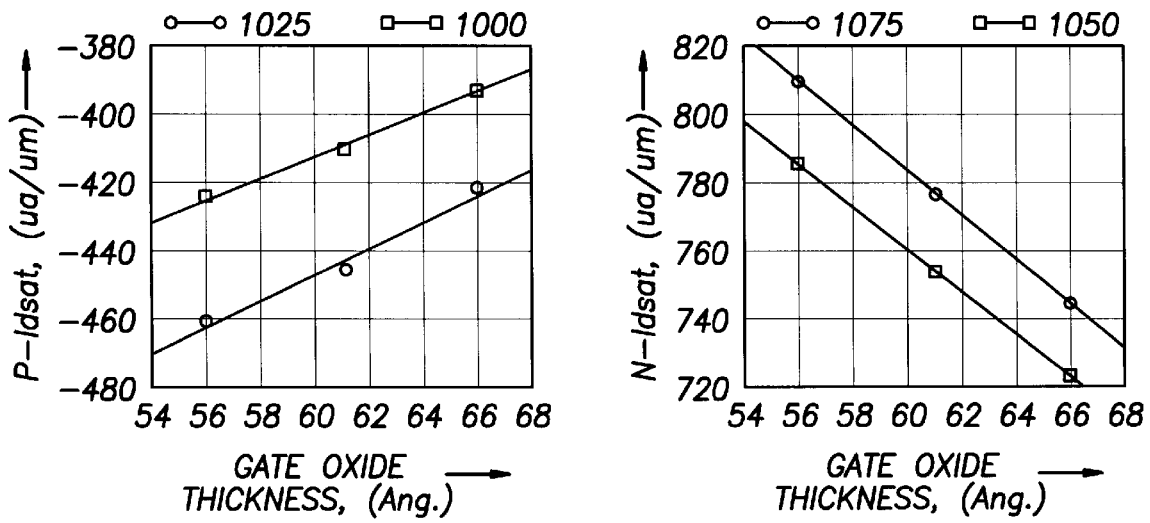
FIG. 16 is a graph of representative data showing $I_{Dsat}$ as a function of gate oxide thickness for n-channel and p-channel devices.

FIG. 16 shows representative data of transistors formed with the present invention. The two graphs plot saturated drain current vs. gate oxide thickness for a p-channel and an n-channel device, respectively. In each graph, data is shown for two different anneal temperatures. The data was taken from transistors having widths of 20 microns and channel lengths of 0.35 microns. It can be seen in the figure that, for the p-channel devices, saturated drain current ranges from approximately 420 $\mu a/\mu m$ to approximately 450 $\mu a/\mu m$ for a gate oxide thickness of 60 angstrom depending upon the anneal temperature. For the n-channel devices, saturated drain current ranges from roughly 790 $\mu a/\mu m$ to 760 $\mu a/\mu m$ for a 60 angstrom gate oxide depending upon the anneal temperature. These drain current values represent significant improvements over saturated drain currents achievable using conventional channel doping methodologies that employ well implants channel stop implants and threshold adjust implants.

It will, therefore, be appreciated to those skilled in the art having the benefit of this disclosure that this invention is capable of producing a faster integrated circuits by increasing the saturate drain current of the transistors fabricated thereby. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method of doping a channel region of an MOS transistor, comprising:

providing a silicon substrate, wherein said silicon substrate comprises an least one n-channel region laterally displaced from at least one p-channel region;

doping said n-channel region, wherein said doping consists essentially of:

implanting a first boron bearing impurity exclusively into said n-channel region at an implant energy in the range of approximately 140 to 300 keV and an implant dose in the range of approximately 2E12 to 8E12 atoms/cm$^2$; and implanting a second boron bearing impurity exclusively into said n-channel region at an implant energy in the range of approximately 50 to 160 keV and an implant dose in the range of approximately 2E12 to 8E12 atoms/cm$^2$ wherein a threshold voltage associated with said n-channel region is approximately 250 mV;

doping said p-channel region, wherein said doping consists essentially of:

implanting a first phosphorous impurity into said p-channel region at an implant energy in the range of approximately 360 keV to 500 keV and an implant dose in the range of approximately 2E12 to 8E12 atoms/cm$^2$; and implanting a second phosphorous impurity into said p-channel region at an implant energy in the range of approximately 150 keV to 280 keV and an implant dose in the range of approximately 2E12 to 8E12 atoms/cm$^2$;

forming a gate dielectric layer on an upper surface of said silicon substrate;

forming a gate conductive layer on an upper surface of said gate dielectric layer; and patterning said gate conductive layer to remove portions of said gate conductive layer above source/drain regions of said silicon substrate.

2. The method of claim 1, further comprising rapid thermal annealing said p-channel region of said silicon substrate at a second anneal temperature to repair damage to said silicon substrate caused by the implanting of said first and second phosphorous impurities.

3. The method of claim 1, further comprising rapid thermal annealing said n-channel region of said silicon substrate to repair damage to said substrate caused by the implanting of said first and second boron impurities.

4. The method of claim 1 wherein the step of providing a silicon substrate comprises providing a p-type silicon substrate, wherein a resistivity of an upper region of said silicon substrate is approximately 12 Ω-cm.

5. The method of claim 1, further comprising forming at least one isolation structure in said silicon substrate after said providing step and prior to said implanting steps.

6. The method of claim 1, wherein the step of forming said gate dielectric is executed prior to said implanting steps.

7. The method of claim 1, wherein the step of forming said gate dielectric is executed after said implanting steps.

* * * * *